(12) United States Patent
Hayashi et al.

(10) Patent No.: US 10,396,809 B2
(45) Date of Patent: Aug. 27, 2019

(54) ATOMIC CELL, ATOMIC CELL MANUFACTURING METHOD, QUANTUM INTERFERENCE DEVICE, ATOMIC OSCILLATOR, ELECTRONIC APPARATUS, AND VEHICLE

(71) Applicant: SEIKO EPSON CORPORATION, Tokyo (JP)

(72) Inventors: Nobuhito Hayashi, Chino (JP); Takuya Miyakawa, Matsumoto (JP); Naoki Ishihara, Chino (JP); Yoshiyuki Maki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 193 days.

(21) Appl. No.: 15/420,884

(22) Filed: Jan. 31, 2017

(65) Prior Publication Data

US 2017/0244419 A1    Aug. 24, 2017

(30) Foreign Application Priority Data

Feb. 19, 2016  (JP) ................................. 2016-029988
Feb. 19, 2016  (JP) ................................. 2016-029989
Nov. 15, 2016  (JP) ................................. 2016-222149

(51) Int. Cl.
*H03L 7/26* (2006.01)
*G04F 5/14* (2006.01)

(52) U.S. Cl.
CPC ................ *H03L 7/26* (2013.01); *G04F 5/145* (2013.01)

(58) Field of Classification Search
CPC ... H03L 7/26; G04F 5/145; G04F 5/14; A61B 5/04007; A61B 5/04008;
(Continued)

(56) References Cited

U.S. PATENT DOCUMENTS 7,292,111 B2 * 11/2007 Abbink ..................... G04F 5/14
                                                         331/3
9,151,808 B2    10/2015 Nagasaka et al.
(Continued)

FOREIGN PATENT DOCUMENTS

JP    2012-183290 A    9/2012
JP    2013-007720 A    1/2013
(Continued)

OTHER PUBLICATIONS

Seltzer, S. J., et al. "Investigation of antirelaxation coatings for alkali-metal vapor cells using surface science techniques." The Journal of chemical physics 133.14 (2010): 144703. (Year: 2010).*

*Primary Examiner* — Ryan Johnson
(74) *Attorney, Agent, or Firm* — Oliff PLC

(57) ABSTRACT

An atomic cell is filled with an alkali metal therein and includes an inner wall which is formed from a material containing a compound having a polar group, a first coating layer which coats the inner wall and is formed from a first molecule having a nonpolar group and a functional group that undergoes an elimination reaction with the polar group, and a second coating layer which coats the first coating layer and is formed from a nonpolar second molecule, wherein the second molecule is polypropylene, polyethylene, or polymethylpentene.

10 Claims, 11 Drawing Sheets

(58) Field of Classification Search
CPC ........ A61B 2562/0223; A61B 5/04005; G01R 33/032; G01R 33/26; G01R 33/282; G01K 7/245; H01L 29/66977
See application file for complete search history.

(56) References Cited

U.S. PATENT DOCUMENTS

| | | |
|---|---|---|
| 2013/0230673 A1 | 9/2013 | Nagasaka et al. |
| 2014/0151320 A1* | 6/2014 | Chang .................... B65D 25/14 215/12.2 |
| 2014/0232479 A1* | 8/2014 | Maki ......................... H01S 1/06 331/94.1 |
| 2015/0244382 A1* | 8/2015 | Ishihara ................... H03L 7/26 331/94.1 |
| 2015/0377984 A1 | 12/2015 | Nagasaka et al. |

FOREIGN PATENT DOCUMENTS

| | | |
|---|---|---|
| JP | 2013-134086 A | 7/2013 |
| JP | 2013-181941 A | 9/2013 |
| JP | 2015-053452 A | 3/2015 |
| JP | 2015-154297 A | 8/2015 |
| JP | 2015-222272 A | 12/2015 |

* cited by examiner

ATOMIC CELL, ATOMIC CELL MANUFACTURING METHOD, QUANTUM INTERFERENCE DEVICE, ATOMIC OSCILLATOR, ELECTRONIC APPARATUS, AND VEHICLE

CROSS-REFERENCE TO RELATED APPLICATIONS

This application claims priority to Japanese Patent Application No. 2016-029988, filed Feb. 19, 2016, Japanese Patent Application No. 2016-029989, filed Feb. 19, 2016, and Japanese Patent Application No. 2016-222149, filed Nov. 15, 2016, the entirety of which is hereby incorporated by reference.

BACKGROUND

1. Technical Field

Various embodiments of the present invention relate to an atomic cell, an atomic sell manufacturing method, a quantum interference device, an atomic oscillator, an electronic apparatus, and a vehicle.

2. Related Art

As an oscillator having highly accurate oscillation characteristics for a long period of time, there has been known an atomic oscillator which oscillates based on energy transition of atoms of an alkali metal such as rubidium or cesium.

In general, an operation principle of the atomic oscillator is broadly classified into a technique utilizing a double resonance phenomenon caused by a light and a microwave and a technique utilizing a quantum interference effect (coherent population trapping (CPT)) caused by two lights with different wavelengths. Either atomic oscillator includes a gas cell (atomic cell) in which an alkali metal is enclosed.

For example, JP-A-2013-181941 describes that by forming an OTS layer on an inner wall of a gas cell, the exposure of a polar group on the surface of the inner wall of the gas cell is reduced, and also by forming a paraffin layer on the OTS layer, the non-relaxation characteristic of the inner wall of the gas cell can be enhanced, and such a gas cell is used in an atomic oscillator.

However, paraffin has a low melting point, and therefore, the atomic cell in which a paraffin layer is formed as described in JP-A-2013-181941 has a problem in heat resistance.

SUMMARY

An advantage of some aspects of the invention is to provide an atomic cell which can have high heat resistance. Another advantage of some aspects of the invention is to provide an atomic sell manufacturing method for producing an atomic cell which can have high heat resistance. Another advantage of some aspects of the invention is to provide a quantum interference device, an atomic oscillator, an electronic apparatus, and a vehicle, each of which includes the atomic cell.

Further, in the gas cell described in JP-A-2013-181941, an alkali metal penetrates into the OTS layer (coating layer), and a bond between a molecule constituting the inner wall and a molecule constituting the coating layer is cleaved by the alkali metal, and therefore, the coating layer is peeled in some cases.

An advantage of some aspects of the invention is to provide an atomic cell which can reduce the possibility of peeling of the coating layer. Another advantage of some aspects of the invention is to provide an atomic sell manufacturing method which can reduce the possibility of peeling of the coating layer. Another advantage of some aspects of the invention is to provide a quantum interference device, an atomic oscillator, an electronic apparatus, and a vehicle, each of which includes the atomic cell.

The invention can be implemented as the following forms or application examples.

Application Example 1

An atomic cell according to this application example is filled with an alkali metal therein, and includes an inner wall which is formed from a material containing a compound having a polar group, a first coating layer which coats the inner wall and is formed from a first molecule having a nonpolar group and a functional group that undergoes an elimination reaction with the polar group, and a second coating layer which coats the first coating layer and is formed from a nonpolar second molecule, wherein the second molecule is polypropylene, polyethylene, or polymethylpentene.

According to such an atomic cell, since polypropylene, polyethylene, or polymethylpentene has a higher melting point than paraffin, the second coating layer has a higher melting point than in the case where the second molecule is paraffin, and therefore, the atomic cell can have high heat resistance.

Application Example 2

In the atomic cell according to the application example, the first molecule may be an alkylsilane, an alcohol, or a polyimide.

According to such an atomic cell, the orientation property of the first coating layer can be enhanced, and further, the orientation property of the second coating layer can also be enhanced. Therefore, in such an atomic cell, the penetration of the alkali metal between the first molecules or between the second molecules can be suppressed.

Application Example 3

In the atomic cell according to the application example, the alkylsilane may be octadecyltrimethoxysilane or octadecyltrichlorosilane.

According to such an atomic cell, in the case where the first molecule is octadecyltrimethoxysilane (ODS), a methoxy group of ODS can undergo an elimination reaction with the polar group of the material which forms the inner wall, and in the case where the first molecule is octadecyltrichlorosilane (OTS), the chlorine of OTS can undergo an elimination reaction with the polar group of the material which forms the inner wall.

Application Example 4

In the atomic cell according to the application example, the first molecule may be octadecyltrimethoxysilane, and the second molecule may be polypropylene.

According to such an atomic cell, for example, as compared with the case where the first molecule is OTS and the second molecule is polyethylene, the handling of the atomic cell is easier and the atomic cell can have higher heat resistance.

Application Example 5

An atomic cell according to this application example is filled with an alkali metal therein, and includes a first coating layer which coats an inner wall and is formed from a first molecule, a second coating layer which coats the first coating layer and is formed from a second molecule having a nonpolar group and a functional group that undergoes an elimination reaction with the first molecule, and a third coating layer which coats the second coating layer and is formed from a nonpolar third molecule, wherein the first molecule is a metal oxide which does not undergo a substitution reaction with the alkali metal.

According to such an atomic cell, even if an alkali metal penetrates into the coating layer, the cleavage of a bond between a molecule of the material which forms the inner wall and the first molecule by the alkali metal can be suppressed. Therefore, in such an atomic cell, the possibility of peeling of the coating layer can be reduced.

Application Example 6

In the atomic cell according to the application example, the first molecule may be tantalum oxide, zirconium oxide, hafnium oxide, or titanium oxide.

According to such an atomic cell, the substitution reaction of the first molecule with the alkali metal can be suppressed.

Application Example 7

In the atomic cell according to the application example, the second molecule may be an alkylsilane, an alcohol, or a polyimide.

According to such an atomic cell, the orientation property of the second coating layer can be enhanced, and further, the orientation property of the third coating layer can also be enhanced. Therefore, in such an atomic cell, the penetration of the alkali metal between the second molecules or between the third molecules can be suppressed.

Application Example 8

In the atomic cell according to the application example, the third molecule may be polypropylene, polyethylene, or polymethylpentene.

According to such an atomic cell, since polypropylene, polyethylene, or polymethylpentene has a higher melting point than paraffin, the third coating layer has a higher melting point than in the case where the third molecule is paraffin, and therefore, the atomic cell can have high heat resistance.

Application Example 9

In the atomic cell according to the application example, the first molecule may be tantalum oxide, the second molecule may be octadecyltrimethoxysilane, and the third molecule may be polypropylene.

According to such an atomic cell, for example, as compared with the case where the second molecule is octadecyltrichlorosilane and the third molecule is polyethylene, the handling of the atomic cell is easier and the atomic cell can have higher heat resistance.

Application Example 10

An atomic sell manufacturing method according to this application example is an atomic sell manufacturing method which is filled with an alkali metal therein, and includes forming a first coating layer by coating an inner wall of a substrate formed from a material containing a compound having a polar group with a first molecule having a nonpolar group and a functional group that undergoes an elimination reaction with the polar group, and forming a second coating layer by coating the first coating layer with a nonpolar second molecule, wherein the second molecule is polypropylene, polyethylene, or polymethylpentene.

According to such an atomic sell manufacturing method, an atomic cell which can have high heat resistance can be produced.

Application Example 11

An atomic sell manufacturing method according to this application example is an atomic sell manufacturing method which is filled with an alkali metal therein, and includes forming a first coating layer by coating an inner wall of a substrate with a first molecule, forming a second coating layer by coating the first coating layer with a second molecule having a nonpolar group and a functional group that undergoes an elimination reaction with the first molecule, and forming a third coating layer by coating the second coating layer with a nonpolar third molecule, wherein the first molecule is a metal oxide which does not undergo a substitution reaction with the alkali metal.

According to such an atomic sell manufacturing method, an atomic cell which can reduce the possibility of peeling of the coating layer can be produced.

Application Example 12

A quantum interference device according to this application example includes the atomic cell according to the application example, a light emitter which emits an excitation light that excites the alkali metal, and a light detector which detects the excitation light transmitted through the atomic cell.

Such a quantum interference device includes the atomic cell according to the application example, and therefore can have excellent frequency stability.

Application Example 13

An atomic oscillator according to this application example includes the atomic cell according to the application example, a light emitter which emits an excitation light that excites the alkali metal, and a light detector which detects the excitation light transmitted through the atomic cell.

Such an atomic oscillator includes the atomic cell according to the application example, and therefore can have excellent frequency stability.

Application Example 14

An electronic apparatus according to this application example includes the atomic cell according to the application example.

Such an electronic apparatus includes the atomic cell according to the application example, and therefore can have excellent reliability.

Application Example 15

A vehicle according to this application example includes the atomic cell according to the application example.

Such a vehicle includes the atomic cell according to the application example, and therefore can have excellent reliability.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, one or more embodiments of the invention will be described in detail with reference to the drawings. Note that the one or more embodiments described below are not intended to unduly limit the various embodiments of the invention described in the appended claims. Further, not all the configurations described in the one or more embodiments are necessarily essential components of the all of the embodiments.

1. First Embodiment

1.1. Atomic Cell

Figure 1:
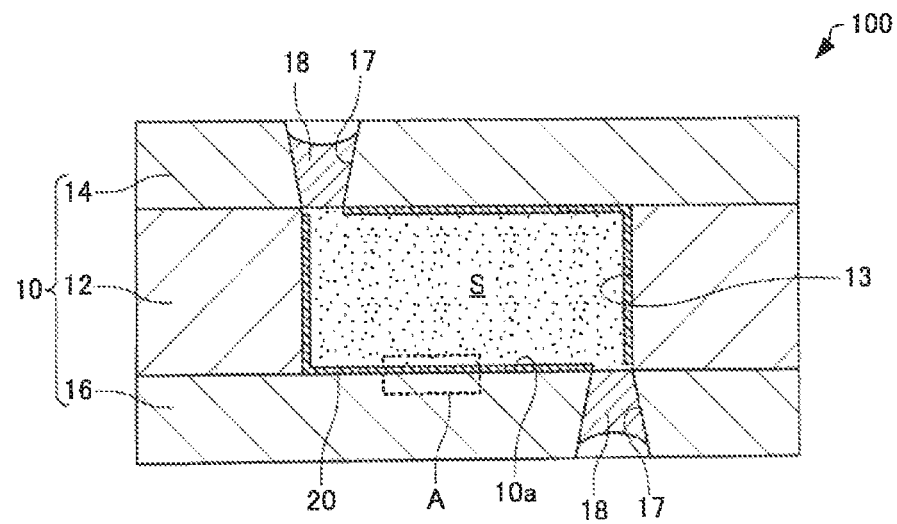
FIG. 1 is a cross-sectional view schematically showing an atomic cell according to first embodiment.
Figure 2:
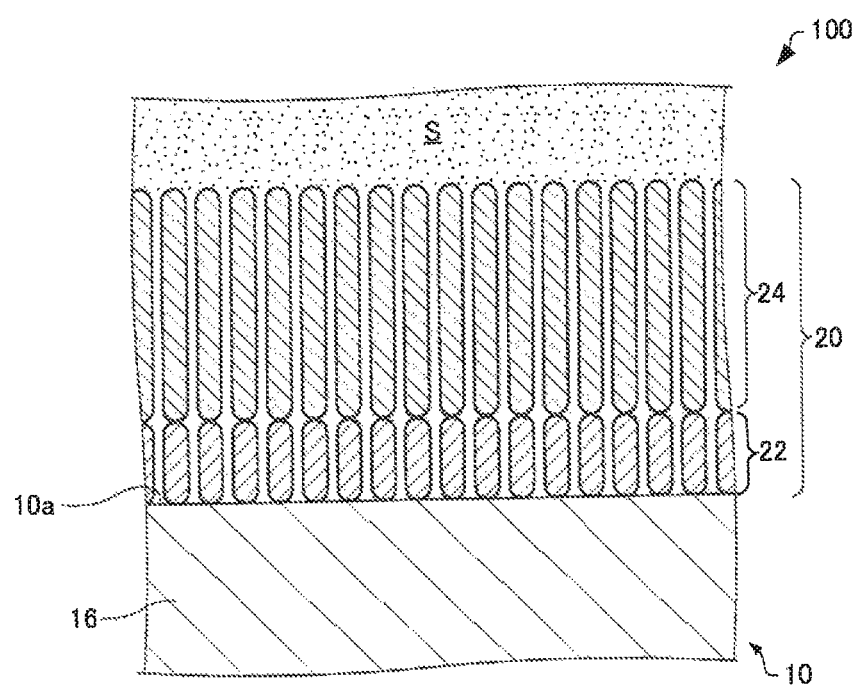
FIG. 2 is a cross-sectional view schematically showing the atomic cell according to the first embodiment.
Figure 3:
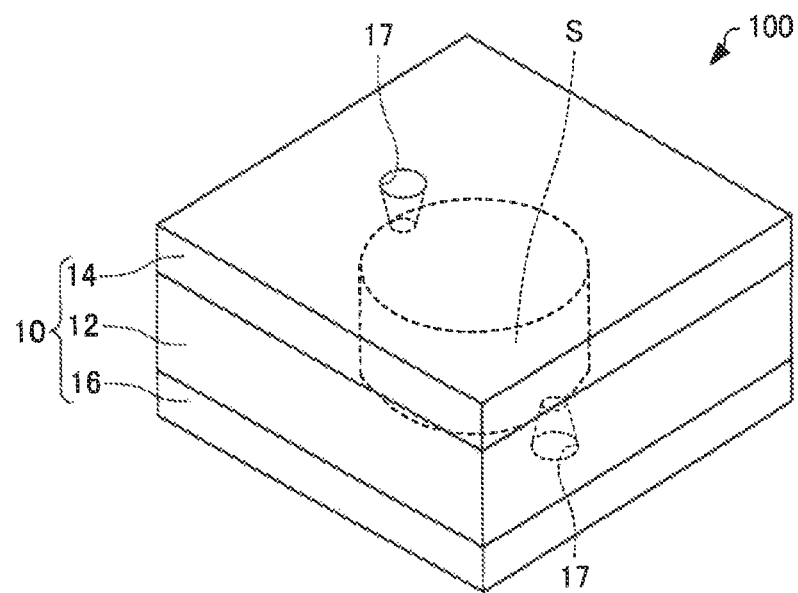
FIG. 3 is a perspective view schematically showing the atomic cell according to the first embodiment.

First, an atomic cell according to a first embodiment will be described with reference to the drawings. FIG. 1 is a cross-sectional view schematically showing an atomic cell 100 according to the first embodiment. FIG. 2 is a cross-sectional view schematically showing the atomic cell 100 according to the first embodiment, and is an enlarged view of a region A shown in FIG. 1. FIG. 3 is a perspective view schematically showing the atomic cell 100 according to the first embodiment.

As shown in FIGS. 1 to 3, the atomic cell 100 includes a substrate 10 and a coating layer 20. The coating layer 20 includes a first coating layer 22 and a second coating layer 24. The atomic cell 100 is used in, for example, an atomic oscillator.

The substrate 10 includes a trunk 12, and a pair of windows 14 and 16 provided so as to interpose the trunk 12 therebetween. In the trunk 12, a cylindrical through-hole 13 is formed. By the through-hole 13, an internal space S of the atomic cell 100 is formed. The cross-sectional shape of the through-hole 13 is not limited to a circle, and may be, for example, a polygon such as a quadrangle or a pentagon, an ellipse, or the like. The material of the trunk 12 is, for example, a glass, quartz, a metal, a resin, silicon, or the like.

The windows 14 and 16 are provided so as to interpose the trunk 12 therebetween to close the through-hole 13. The shape of each of the windows 14 and 16 is, for example, a plate shape. The internal space S of the atomic cell 100 is formed by the trunk 12 and the windows 14 and 16. In the internal space S, an alkali metal (metal atom) in a gaseous state is enclosed. The internal space S is filled with the alkali metal in a gaseous state. The alkali metal enclosed in the internal space S may exist in a gaseous state partially, and the rest thereof may exist in a liquid state or a solid state as an excess portion. Further, in the internal space S, a rare gas such as argon or neon, or an inert gas such as nitrogen may be enclosed as a buffer gas along with the alkali metal as needed.

In each of the windows 14 and 16, a through-hole 17 communicating with the internal space S is provided. The through-hole 17 is sealed with a sealing member 18. By doing this, the internal space S can be airtightly sealed. The material of the sealing member 18 is, for example, silver solder, a metal such as an Au/Sn alloy, a low-melting point glass such as a vanadium-based glass (V—P—O). Although not shown in the drawing, the through-hole 17 may be provided in only one of the windows 14 and 16.

Figure 4:
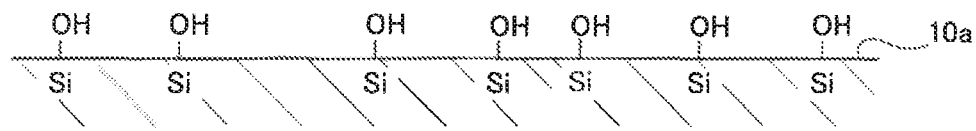
FIG. 4 is a view for illustrating a state in the vicinity of an inner wall of a substrate according to the first embodiment.

The windows 14 and 16 are formed from a material which transmits an excitation light emitted from a light emitter of an atomic oscillator (described later). The excitation light excites the alkali metal in a gaseous state. The windows 14 and 16 are formed from a material containing a compound having a polar group. Specifically, the windows 14 and 16 are formed from a material such as quartz glass or borosilicate glass. These materials contain silicon and oxygen (for example, contain silicon and oxygen as main components), and a hydroxy group which is a polar group is bonded to silicon on the surface (see FIG. 4). That is, the windows 14 and 16 are formed from a material containing a compound having a polar group. The trunk 12 may be formed from the same material as the windows 14 and 16.

The first coating layer 22 is provided on the surface of an inner wall 10a of the substrate 10. The first coating layer 22 may be provided at least on the inner walls of the windows 14 and 16, but is preferably provided on the inner walls of the windows 14 and 16 and also on the inner wall of the trunk 12 as shown in FIG. 1. Further, although not shown in the drawing, the first coating layer 22 may be provided on the surface of the internal space S side of the sealing member 18. The first coating layer 22 coats the inner wall 10a. The thickness of the first coating layer 22 is, for example, several nanometers.

The first coating layer 22 is formed from a first molecule having a nonpolar group and a functional group which undergoes an elimination reaction with the polar group (for example, a hydroxy group) of the material which forms the inner wall 10a. Specifically, the first coating layer 22 is formed by chemically reacting the functional group of the first molecule with the hydroxy group of the material which forms the inner wall 10a.

The first molecule which forms the first coating layer 22 is an alkylsilane, an alcohol, or a polyimide. In the case where the first molecule is an alkylsilane, the alkylsilane is octadecyltrimethoxysilane (ODS, $CH_3(CH_2)_{17}Si(OCH_3)_3$) or octadecyltrichlorosilane (OTS, $CH_3(CH_2)_{17}SiCl_3$). The chemical formula of ODS is the following formula (1). The decomposition temperature of ODS is about 200° C. The chemical formula of OTS is the following formula (2). The decomposition temperature of OTS is about 200° C.

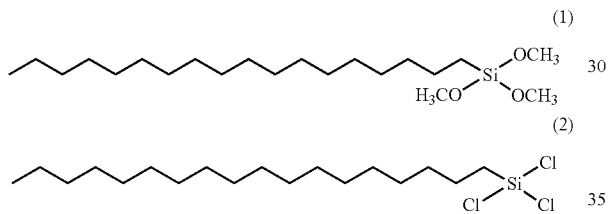

(1)

(2)

In the case where ODS is used as the first molecule which forms the first coating layer 22, ODS has a methoxy group which undergoes an elimination reaction with a hydroxy group of the material which forms the inner wall 10a. ODS is, for example, applied to the surface of the inner wall 10a in a state of being dispersed in a solvent such as cyclohexane, hexane, or chloroform. When ODS reaches a hydroxy group of the material which forms the inner wall 10a, the methoxy group of ODS and the hydrogen of the hydroxy group are eliminated, and the silicon of ODS and the oxygen of the material which forms the inner wall 10a are bonded to each other (see FIG. 5). In this manner, the first coating layer 22 is formed.

Figure 5:
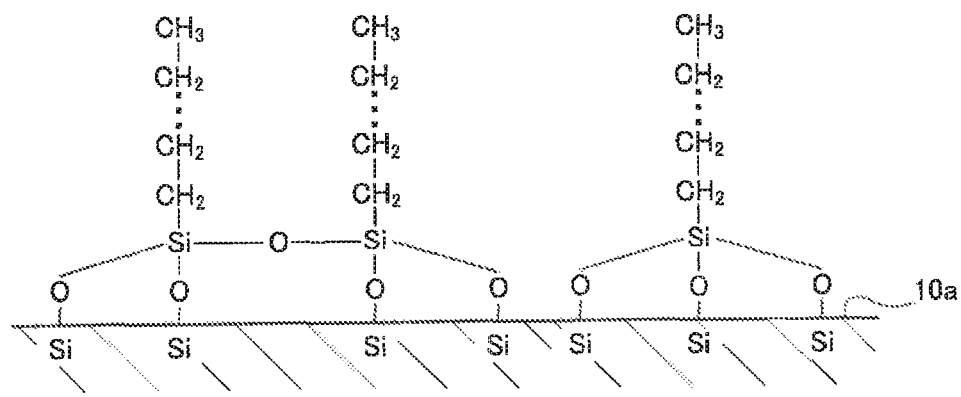
FIG. 5 is a view for illustrating a reaction between ODS and the inner wall of the substrate.

The bonding form between the silicon of ODS and the oxygen of the inner wall 10a may be different for each molecule of ODS, and for example, as shown in FIG. 5, there is also a case where two silicon atoms of ODS are bonded to an oxygen atom eliminated from the silicon of the inner wall 10a.

In the case where OTS is used as the first molecule which forms the first coating layer 22, the hydroxy group of the material which forms the inner wall 10a and the chlorine of OTS undergo an elimination reaction.

As shown in FIG. 5, the hydrocarbon (nonpolar group) of the first molecule which forms the first coating layer 22 has a linear structure. In the example shown in the drawing, the chain of carbon atoms forming each first molecule extends in parallel with the vertical line of the inner wall 10a. According to this, the first coating layer 22 has a high orientation property.

In the case where the first molecule which forms the first coating layer 22 is an alcohol, the first molecule is, for example, a linear alcohol such as decyl alcohol or octadecyl alcohol.

The second coating layer 24 is provided on the surface of the first coating layer 22. The second coating layer 24 coats the first coating layer 22. The second coating layer 24 is formed from a nonpolar second molecule.

The second molecule which forms the second coating layer 24 is polypropylene (PP), polyethylene (PE), or polymethylpentene (PMP). Polypropylene to be used as the second molecule may be isotactic polypropylene or syndiotactic polypropylene. The first molecule may be ODS, and the second molecule may be PP.

The chemical formula of PP is the following formula (3). The melting point of PP is about 170° C. The number average molecular weight Mn of PP is about 5000, and the weight average molecular weight Mw of PP is about 12000. The chemical formula of PE is the following formula (4). The melting point of PE is about 120° C. PP and PE are crosslinked by, for example, irradiation with an electron beam, and can have a high melting point. The melt index (MI) of PE is about 2.2 g/10 min (190° C./2.16 kg). The chemical formula of PMP is the following formula (5). The melting point of PMP is about 230° C.

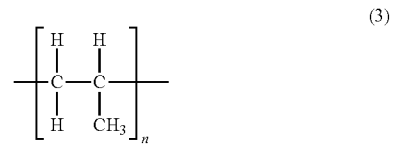

(3)

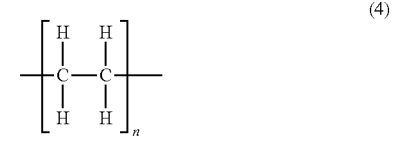

(4)

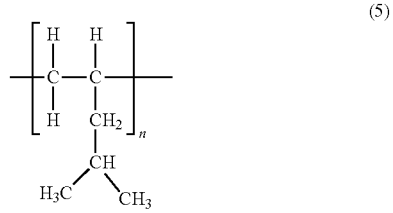

(5)

Figure 6:
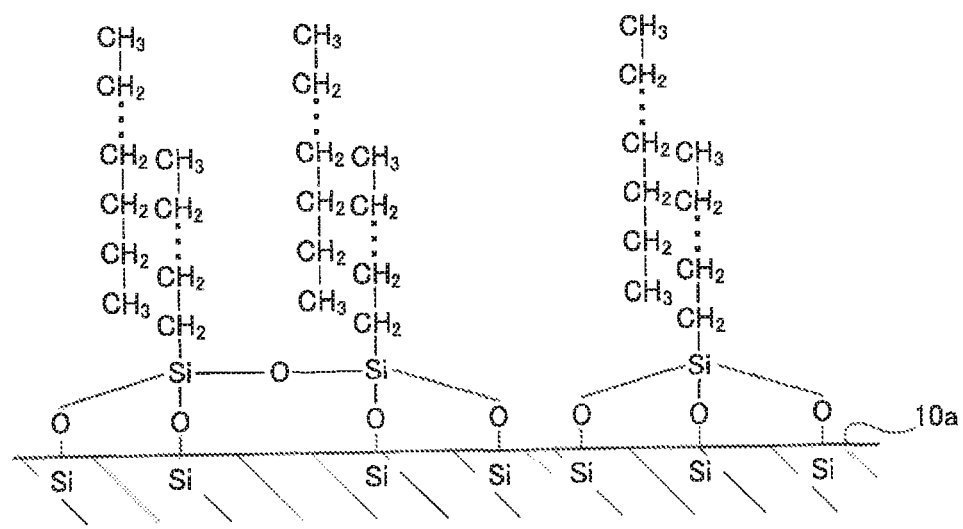
FIG. 6 is a view for illustrating a reaction between polypropylene and ODS.

The second molecule which forms the second coating layer 24 is physically adsorbed on the first molecule which forms the first coating layer 22. FIG. 6 is a view showing a state in which when ODS is used as the first molecule and PP is used as the second molecule, PP is physically adsorbed on ODS. PP is a nonpolar molecule, but has a large molecular weight, and therefore, a strong intermolecular attractive force is generated between PP and the nonpolar group of ODS. Then, PP is physically adsorbed on the nonpolar group of ODS by the intermolecular attractive force. In this manner, the second coating layer 24 is formed.

By depositing the second molecule which forms the second coating layer 24 a plurality of times, the thickness of the second coating layer 24 can be adjusted. The thickness of the second coating layer 24 is, for example, several hundred nanometers. By the second coating layer 24, the exposure of the inner wall 10a can be reduced. According to this, the coating layer 20 has a high coverage for the inner wall 10a. Further, the second coating layer 24 is affected by the orientation property of the first coating layer 22, and therefore has a high orientation property. The second coating layer 24 can suppress the relaxation of the electron spin state of the alkali metal by the collision of the alkali metal with the inner wall 10a. That is, the second coating layer 24 can enhance the non-relaxation characteristic of the atomic cell 100 for the alkali metal.

The atomic cell 100 has, for example, the following features.

In the atomic cell 100, the first coating layer 22 which coats the inner wall 10a and is formed from a first molecule having a nonpolar group and a functional group that undergoes an elimination reaction with a polar group, and the second coating layer 24 which coats the first coating layer 22 and is formed from a nonpolar second molecule are included, and the second molecule is PP, PE, or PMP. PP, PE, or PMP has a higher melting point than paraffin (the melting point of paraffin is about 80° C.). Therefore, the second coating layer 24 has a higher melting point than in the case where the second molecule is paraffin, and thus, the atomic cell 100 can have high heat resistance. Further, in the atomic cell 100, the exposure of the inner wall 10a can be suppressed by the second coating layer 24. Therefore, in the atomic cell 100, the possibility that the alkali metal collides with the second coating layer 24 without colliding with the inner wall 10a is high even under a higher temperature (for example, 100° C. or higher) condition, so that the effect on the quantum state of the alkali metal by collision can be decreased. Specifically, in the atomic cell 100, the relaxation of the electron spin state of the alkali metal by collision can be reduced even under a higher temperature condition.

In the atomic cell 100, the first molecule is an alkylsilane, an alcohol, or a polyimide. Therefore, in the atomic cell 100, the orientation property of the first coating layer 22 can be enhanced. That is, in the atomic cell 100, each hydrocarbon chain (nonpolar group) of the first molecule which forms the first coating layer 22 extends in the same direction. Due to this, in the atomic cell 100, also the orientation property of the second coating layer 24 can be enhanced. Therefore, in the atomic cell 100, the penetration of the alkali metal between the first molecules or between the second molecules can be suppressed. Further, even if the second coating layer 24 is melted, since the first coating layer 22 is oriented, the orientation property of the second coating layer 24 can be restored by merely cooling once without ripening.

In the atomic cell 100, the first molecule is ODS or OTS. Therefore, in the atomic cell 100, in the case where the first molecule is ODS, a methoxy group of ODS can undergo an elimination reaction with the polar group of the material which forms the inner wall 10a, and in the case where the first molecule is OTS, the chlorine of OTS can undergo an elimination reaction with the polar group of the material which forms the inner wall 10a.

In the atomic cell 100, the first molecule is ODS and the second molecule is PP. For example, in the case where the first molecule is OTS, hydrogen chloride whose handling requires special care is sometimes generated when OTS undergoes an elimination reaction with the inner wall 10a, however, in the case where the first molecule is ODS, such special care is not required and ODS can be handled easily. Further, PP has a higher melting point than PE. Therefore, by using ODS as the first molecule and PP as the second molecule, the atomic cell 100 is easy to handle and also can have higher heat resistance.

1.2. Method for Producing Atomic Cell

Figure 7:
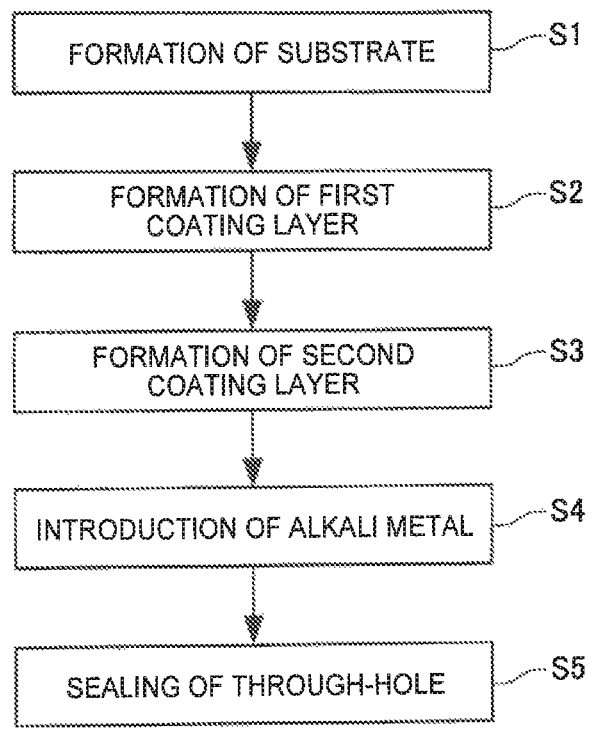
FIG. 7 is a flowchart for illustrating an atomic sell manufacturing method according to the first embodiment.
Figure 8:
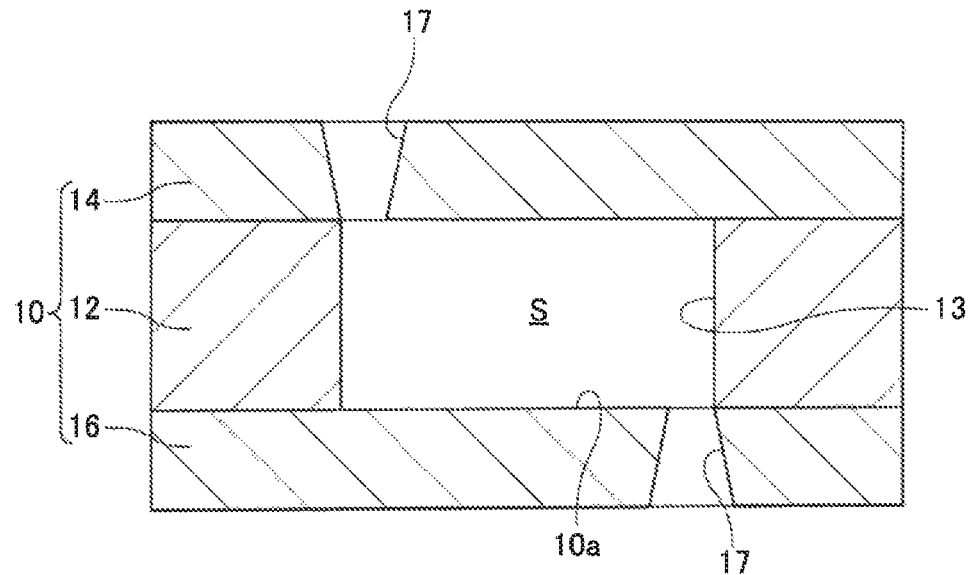
FIG. 8 is a cross-sectional view schematically showing a step of producing the atomic cell according to the first embodiment.
Figure 9:
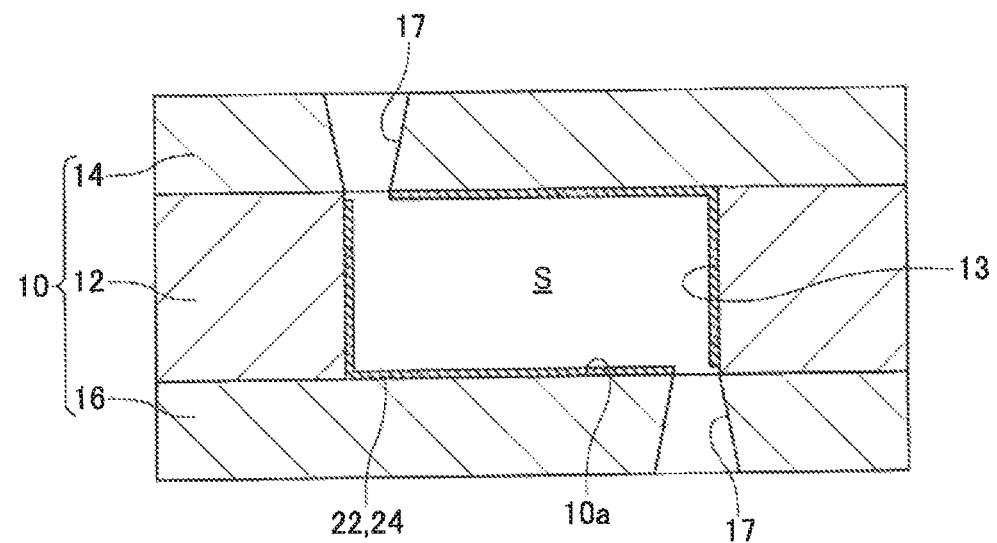
FIG. 9 is a cross-sectional view schematically showing a step of producing the atomic cell according to the first embodiment.

Next, a method for producing the atomic cell according to the first embodiment will be described with reference to the drawings. FIG. 7 is a flowchart for illustrating a method for producing the atomic cell 100 according to the first embodiment. FIGS. 8 and 9 are each a cross-sectional view schematically showing a step of producing the atomic cell 100 according to the first embodiment.

As shown in FIG. 8, the substrate 10 is formed by bonding the windows 14 and 16 to the trunk 12 (Step S1). As the method for bonding the trunk 12 to the windows 14 and 16, for example, a bonding method using an adhesive, a direct bonding method, an anodic bonding method, or the like is used.

As shown in FIG. 9, the first coating layer 22 is formed by coating the inner wall 10a of the substrate 10 with the first molecule (Step S2). The first coating layer 22 is formed by, for example, an application method, a CVD (Chemical Vapor Deposition) method, or the like. In the case where the first coating layer 22 is formed by an application method, the first molecule is dispersed in a given solvent, and the resulting dispersion is applied to the surface of the inner wall 10a through the through-hole 17, followed by drying. In the case where the first coating layer 22 is formed by a CVD method, the first molecule in a gaseous state is passed through the through-hole 17 and deposited on the surface of the inner wall 10a.

Subsequently, the second coating layer 24 is formed by coating the first coating layer 22 with the second molecule (Step S3). By doing this, the coating layer 20 can be formed. The second coating layer 24 is formed by, for example, an application method, a vacuum deposition method, or the like. In the case where the second coating layer 24 is formed by an application method, the second molecule is dispersed in a given solvent, and the resulting dispersion is applied to the surface of the first coating layer 22 through the through-hole 17, followed by drying. In the case where the second coating layer 24 is formed by a vacuum deposition method, the second molecule in a gaseous state is passed through the through-hole 17 and deposited on the surface of the first coating layer 22.

As shown in FIG. 1, the alkali metal in a gaseous state is introduced into the internal space S through the through-hole 17 (Step S4). The introduction of the alkali metal is performed under the condition (temperature and pressure) that the coating layer 22 or 24 is not melted.

Subsequently, the through-hole 17 is sealed with the sealing member 18 (Step S5). For example, by melting a ball-shaped sealing material (not shown) with a laser or the like, the sealing member 18 which seals the through-hole 17 can be formed. By doing this, the internal space S in which the alkali metal is enclosed can be airtightly sealed.

By the above steps, the atomic cell 100 can be produced.

In the method for producing the atomic cell 100, the atomic cell 100 which can have high heat resistance can be produced.

2. Second Embodiment 2.1. Atomic Cell

Figure 10:
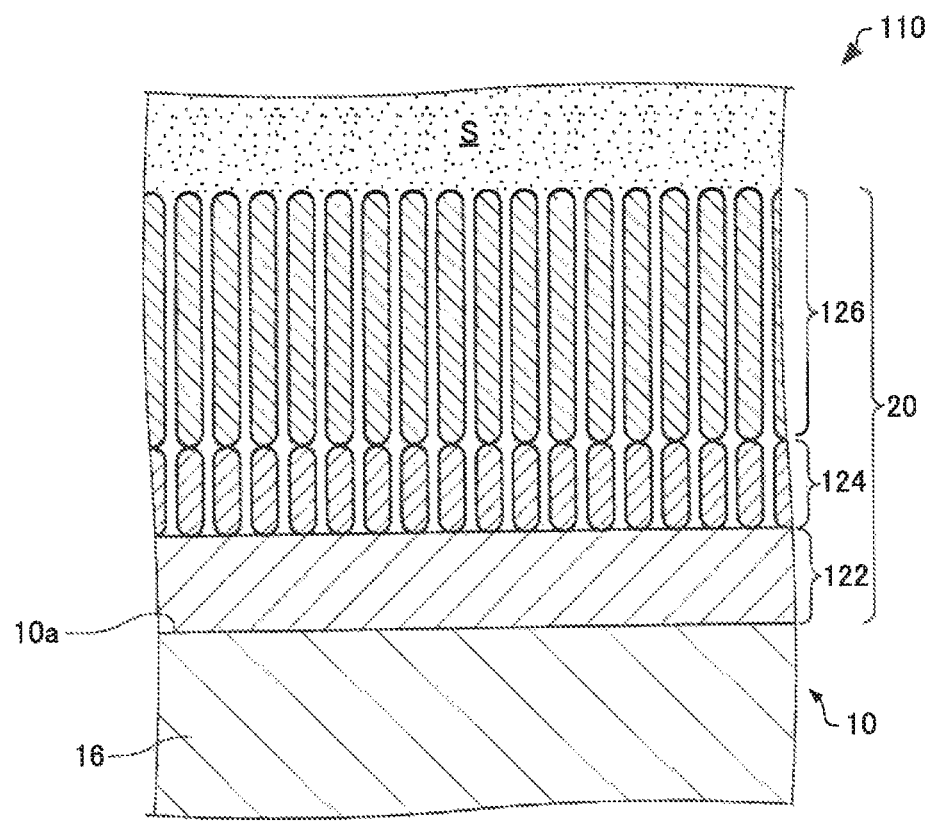
FIG. 10 is a cross-sectional view schematically showing an atomic cell according to second embodiment.

Next, an atomic cell according to a second embodiment will be described with reference to the drawings. FIG. 10 is a cross-sectional view schematically showing an atomic cell 110 according to this embodiment. Hereinafter, in the atomic cell 110 according to the second embodiment, members having the same functions as those of the constituent members of the atomic cell 100 according to the above-mentioned first embodiment are denoted by the same reference numerals, and the detailed description thereof will be omitted.

As shown in FIG. 10, the atomic cell 110 is different from the above-mentioned atomic cell 100 in that the coating layer 20 includes a first coating layer 122, a second coating layer 124, and a third coating layer 126.

Figure 11:
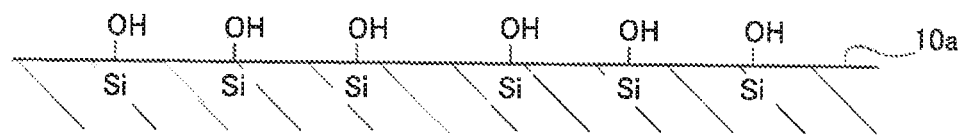
FIG. 11 is a view for illustrating a state in the vicinity of an inner wall of a substrate according to the second embodiment.

The windows 14 and 16 are formed from a material containing a compound having a polar group as described above. Specifically, the windows 14 and 16 are formed from a material such as quartz glass or borosilicate glass. These materials contain silicon and oxygen (for example, contain silicon and oxygen as main components), and a hydroxy group which is a polar group is bonded to silicon on the surface (see FIG. 11).

The first coating layer 122 is provided on the surface of the inner wall 10a of the substrate 10. The first coating layer 122 may be provided at least on the inner walls of the windows 14 and 16, but is preferably provided on the inner walls of the windows 14 and 16 and also on the inner wall of the trunk 12 as shown in FIG. 10. Further, although not shown in the drawing, the first coating layer 122 may be provided on the surface of the internal space S side of the sealing member 18. The first coating layer 122 coats the inner wall 10a. The thickness of the first coating layer 122 is, for example, several ten nanometers.

Figure 12:
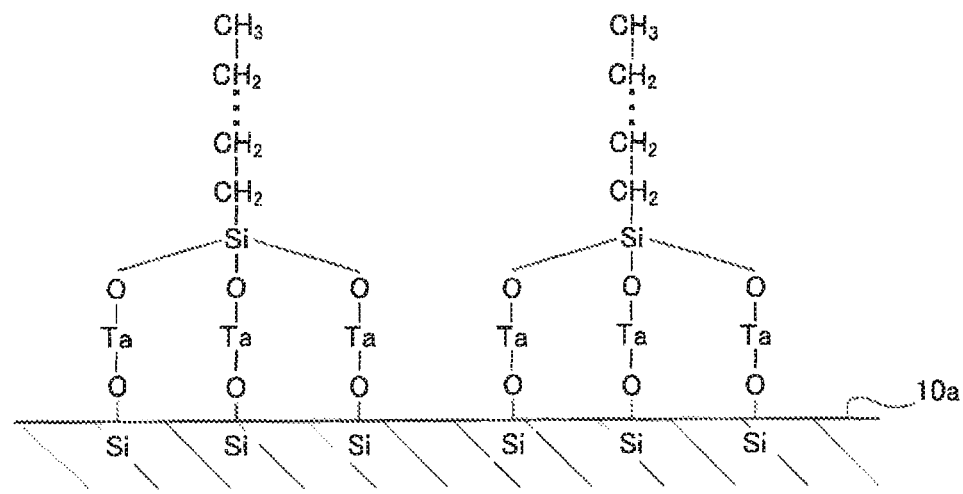
FIG. 12 is a view for illustrating a reaction among ODS, tantalum oxide, and the inner wall of the substrate.

The first coating layer 122 is formed from a first molecule which is a metal oxide. The first molecule is, for example, tantalum oxide ($TaO_x$), zirconium oxide ($ZrO_x$), hafnium oxide ($HfO_x$), or titanium oxide ($TiO_x$). As shown in FIG. 12, the oxygen of the first molecule substitutes a hydroxy group of the material which forms the inner wall 10a, thereby bonding the metal atom (tantalum in the example shown in the drawing) of the first molecule to the silicon of the material which forms the inner wall 10a.

The first molecule which forms the first coating layer 122 is a metal oxide which does not chemically react (specifically does not undergo a substitution reaction) with the alkali metal. That is, the oxygen of the first molecule which bonds the metal atom of the first molecule to the silicon of the material which forms the inner wall 10a is not substituted by the alkali metal. Due to this, the possibility of peeling of the coating layer 20 from the inner wall 10a can be reduced.

The second coating layer 124 is provided on the surface of the first coating layer 122. The second coating layer 124 coats the first coating layer 122. The thickness of the second coating layer 124 is, for example, several nanometers.

The second coating layer 124 is formed from a second molecule having a nonpolar group and a functional group that undergoes an elimination reaction with the first molecule which forms the first coating layer 122. Specifically, the second coating layer 124 is formed by chemically reacting the functional group of the second molecule with the first molecule.

The second molecule which forms the second coating layer 124 is an alkylsilane, an alcohol, or a polyimide. In the case where the second molecule is an alkylsilane, the alkylsilane is octadecyltrimethoxysilane (ODS) or octadecyltrichlorosilane (OTS).

In the case where ODS is used as the second molecule which forms the second coating layer 124, a methoxy group of ODS is substituted by the oxygen of the first molecule which forms the first coating layer 122, and as shown in FIG. 12, the oxygen of the first molecule bonds the metal atom (tantalum in the example shown in the drawing) of the first molecule to the silicon of ODS. In this manner, the second coating layer 124 is formed. ODS is, for example, applied to the surface of the first coating layer 122 in a state of being dispersed in a solvent such as cyclohexane, hexane, or chloroform.

In the case where OTS is used as the second molecule which forms the second coating layer 124, the chlorine of OTS is substituted by the oxygen of the first molecule which forms the first coating layer 122.

As shown in FIG. 12, the hydrocarbon (nonpolar group) of the second molecule which forms the second coating layer 124 has a linear structure. In the example shown in the drawing, the chain of carbon atoms forming each second molecule extends in parallel with the vertical line of the inner wall 10a. According to this, the second coating layer 124 has a high orientation property.

In the case where the second molecule which forms the second coating layer 124 is an alcohol, the second molecule is, for example, a linear alcohol such as decyl alcohol or octadecyl alcohol.

The third coating layer 126 is provided on the surface of the second coating layer 124. The third coating layer 126 coats the second coating layer 124. The third coating layer 126 is formed from a nonpolar third molecule.

The third molecule which forms the third coating layer 126 is polypropylene (PP), polyethylene (PE), or polymethylpentene (PMP). Polypropylene to be used as the third molecule may be isotactic polypropylene or syndiotactic polypropylene. The first molecule may be tantalum oxide, the second molecule may be ODS, and the third molecule may be PP.

Figure 13:
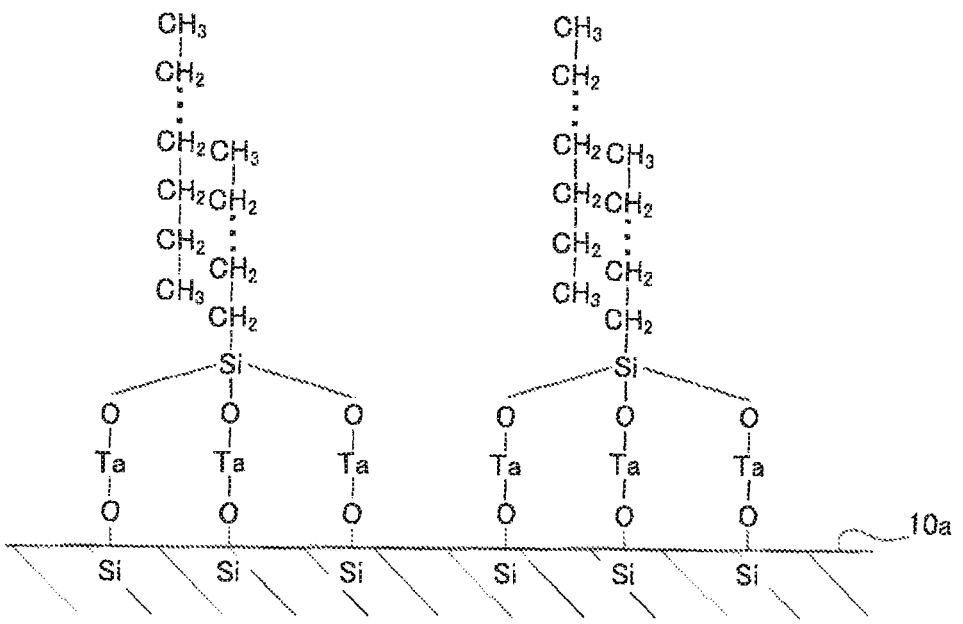
FIG. 13 is a view for illustrating a reaction between polypropylene and ODS.

The third molecule which forms the third coating layer 126 is physically adsorbed on the second molecule which forms the second coating layer 124. FIG. 13 is a view showing a state in which when ODS is used as the second molecule and PP is used as the third molecule, PP is physically adsorbed on ODS. PP is a nonpolar molecule, but has a large molecular weight, and therefore, a strong intermolecular attractive force is generated between PP and the nonpolar group of ODS. Then, PP is physically adsorbed on the nonpolar group of ODS by the intermolecular attractive force. In this manner, the third coating layer 126 is formed.

By depositing the third molecule which forms the third coating layer 126 a plurality of times, the thickness of the third coating layer 126 can be adjusted. The thickness of the third coating layer 126 is, for example, several hundred nanometers. By the third coating layer 126, the exposure of the inner wall 10a can be reduced. By doing this, the coating layer 20 has a high coverage for the inner wall 10a. Further, the third coating layer 126 is affected by the orientation property of the second coating layer 124, and therefore has a high orientation property. The third coating layer 126 can suppress the relaxation of the electron spin state of the alkali metal by the collision of the alkali metal with the inner wall 10a. That is, the third coating layer 126 can enhance the non-relaxation characteristic of the atomic cell 110 for the alkali metal.

The atomic cell 110 has, for example, the following features.

In the atomic cell 110, the first coating layer 122 which coats the inner wall 10a and is formed from a first molecule, the second coating layer 124 which coats the first coating layer 122 and is formed from a second molecule having a nonpolar group and a functional group that undergoes an elimination reaction with the first molecule, and the third coating layer 126 which coats the second coating layer 124 and is formed from a nonpolar third molecule are included, and the first molecule is a metal oxide which does not undergo a substitution reaction with the alkali metal. Therefore, even if the alkali metal penetrates into the coating layer 20 in the atomic cell 110, the cleavage of a bond between the molecule of the material which forms the inner wall 10a and the first molecule by the alkali metal can be suppressed. Therefore, in the atomic cell 110, the possibility of peeling of the coating layer 20 can be reduced.

In the atomic cell 110, the first molecule is tantalum oxide, zirconium oxide, hafnium oxide, or titanium oxide. Therefore, in the atomic cell 110, the substitution reaction of the first molecule with the alkali metal can be suppressed.

In the atomic cell 110, the second molecule is an alkylsilane, an alcohol, or a polyimide. Therefore, in the atomic cell 110, the orientation property of the second coating layer 124 can be enhanced. That is, in the atomic cell 110, each hydrocarbon chain (nonpolar group) of the second molecule which forms the second coating layer 124 extends in the same direction. Due to this, in the atomic cell 110, also the orientation property of the third coating layer 126 can be enhanced. Therefore, in the atomic cell 110, the penetration of the alkali metal between the second molecules or between the third molecules can be suppressed. Further, even if the third coating layer 126 is melted, since the second coating layer 124 is oriented, the orientation property of the third coating layer 126 can be restored by merely cooling once without ripening.

In the atomic cell 110, the third molecule is PP, PE, or PMP. PP, PE, or PMP has a higher melting point than paraffin (the melting point of paraffin is about 80° C.). Therefore, the third coating layer 126 has a higher melting point than in the case where the third molecule is paraffin, and thus, the atomic cell 110 can have high heat resistance. Further, in the atomic cell 110, the exposure of the inner wall 10a can be suppressed by the third coating layer 126. Therefore, in the atomic cell 110, the possibility that the alkali metal collides with the third coating layer 126 without colliding with the inner wall 10a is high even under a higher temperature (for example, 100° C. or higher) condition, so that the effect on the quantum state of the alkali metal by collision can be decreased. Specifically, in the atomic cell 110, the relaxation of the electron spin state of the alkali metal by collision can be reduced even under a higher temperature condition.

In the atomic cell 110, the first molecule is tantalum oxide, the second molecule is ODS, and the third molecule is PP. For example, in the case where the second molecule is OTS, chlorine whose handling requires special care is sometimes generated when OTS undergoes an elimination reaction with the first molecule, however, in the case where the second molecule is ODS, such special care is not required and ODS can be handled easily. Further, PP has a higher melting point than PE. Therefore, by using ODS as the second molecule and PP as the third molecule, the atomic cell 110 is easy to handle and also can have higher heat resistance.

2.2. Method for Producing Atomic Cell

Figure 14:
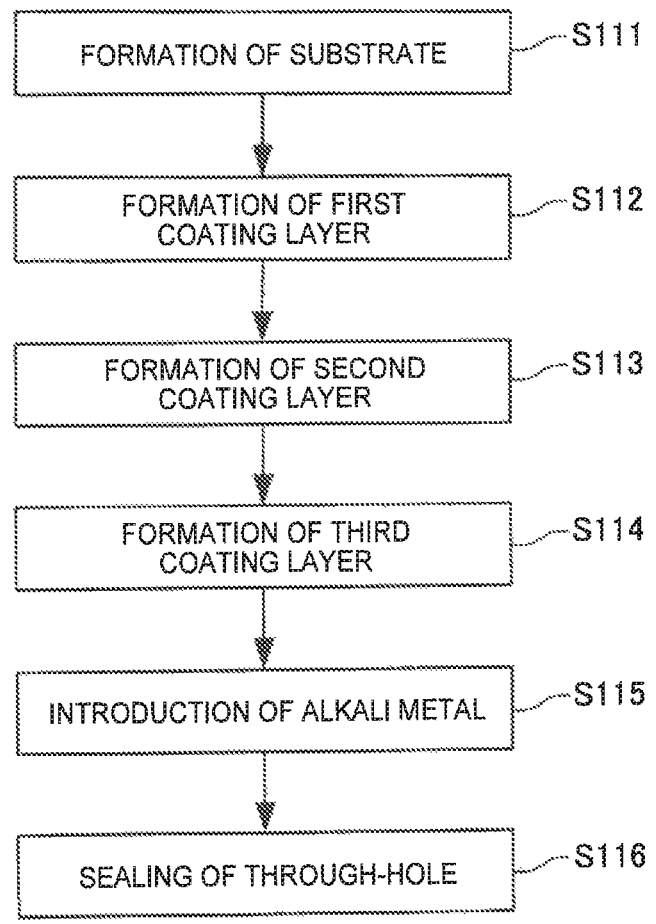
FIG. 14 is a flowchart for illustrating an atomic sell manufacturing method according to the second embodiment.

Next, a method for producing the atomic cell according to the second embodiment will be described with reference to the drawings. FIG. 14 is a flowchart for illustrating a method for producing the atomic cell 110 according to the second embodiment.

Steps S111, S115, and S116 in the method for producing the atomic cell 110 are basically the same as Steps S1, S4, and S5, respectively, in the above-mentioned method for producing the atomic cell 100. Therefore, the description of Steps S111, S115, and S116 will be omitted, and Steps S112, S113, and S114 will be described.

The first coating layer 122 is formed by coating the inner wall 10a of the substrate 10 with the first molecule (Step S112). The first coating layer 122 is formed by, for example, a CVD method, an ALD method, a sputtering method, an ion plating method, a sol-gel method, or the like. In the case where the first coating layer 122 is formed by, for example, a CVD method, the first molecule in a gaseous state is deposited on the surface of the inner wall 10a through the through-hole 17.

Subsequently, the second coating layer 124 is formed by coating the first coating layer 122 with the second molecule (Step S113). The second coating layer 124 is formed by, for example, an application method, a CVD method, or the like. In the case where the second coating layer 124 is formed by an application method, the second molecule is dispersed in a given solvent, and the resulting dispersion is applied to the surface of the first coating layer 122 through the through-hole 17, followed by drying. In the case where the second coating layer 124 is formed by a CVD method, the second molecule in a gaseous state is passed through the through-hole 17 and deposited on the surface of the first coating layer 122.

Subsequently, the third coating layer 126 is formed by coating the second coating layer 124 with the third molecule (Step S114). By doing this, the coating layer 20 can be formed. The third coating layer 126 is formed by, for example, an application method, a vacuum deposition method, or the like. In the case where the third coating layer 126 is formed by an application method, the third molecule is dispersed in a given solvent, and the resulting dispersion is applied to the surface of the second coating layer 124 through the through-hole 17, followed by drying. In the case where the third coating layer 126 is formed by a vacuum deposition method, the third molecule in a gaseous state is passed through the through-hole 17 and deposited on the surface of the second coating layer 124.

By the above steps, the atomic cell 110 can be produced.

In the method for producing the atomic cell 110, the atomic cell 110 which can reduce the possibility of peeling of the coating layer 20 can be produced.

3. Third Embodiment

Next, an atomic oscillator (quantum interference device) according to a third embodiment will be described with reference to the drawings. The quantum interference device according to the embodiment includes the atomic cell according to the embodiments. Hereinafter, an atomic oscillator including the atomic cell 100 according to the embodiment will be described. The quantum interference device according to the embodiment can also be applied to, for example, a magnetic sensor, a quantum memory, or the like other than the atomic oscillator.

Figure 15:
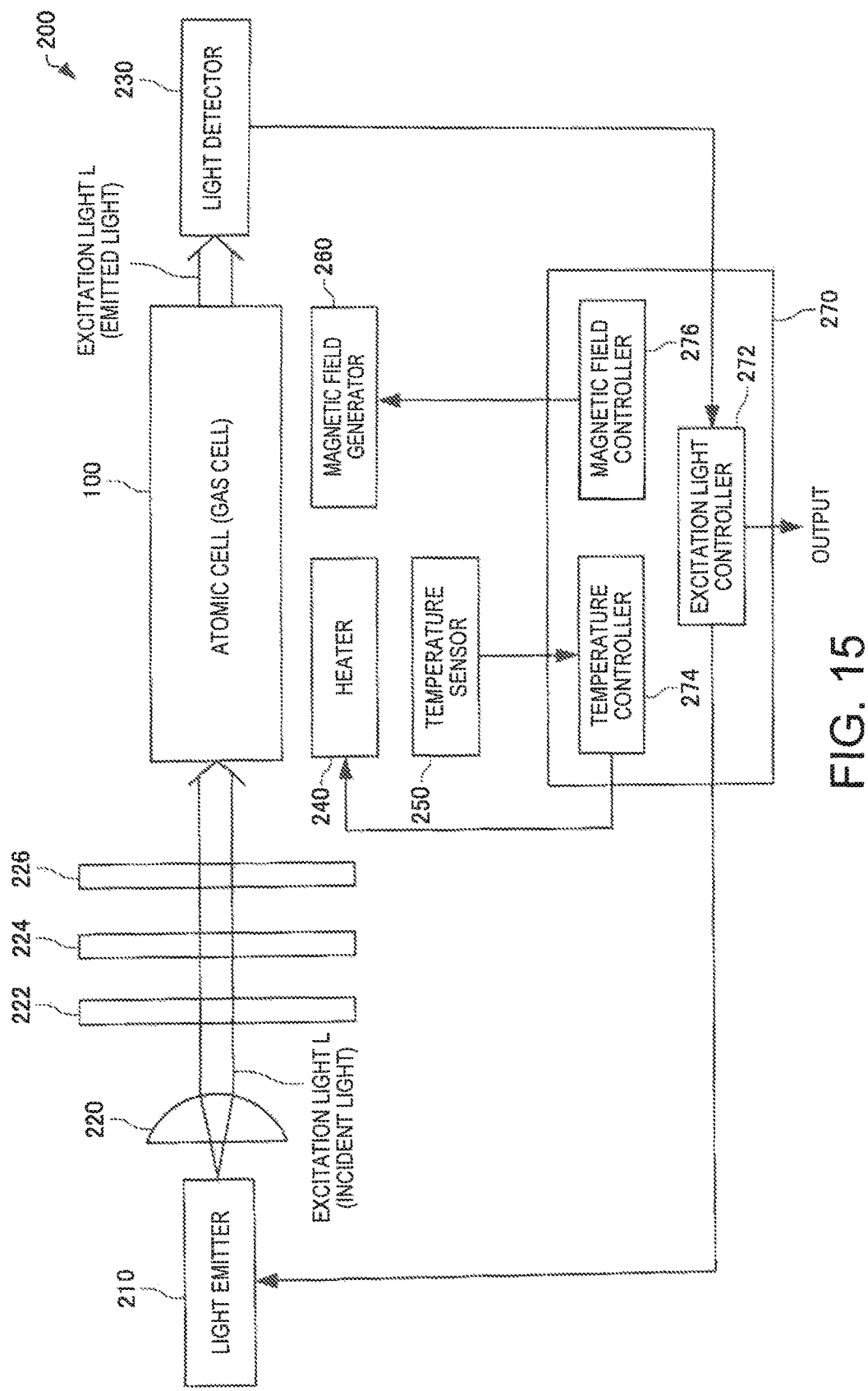
FIG. 15 is a functional block diagram of an atomic oscillator according to third embodiment.
Figure 16:
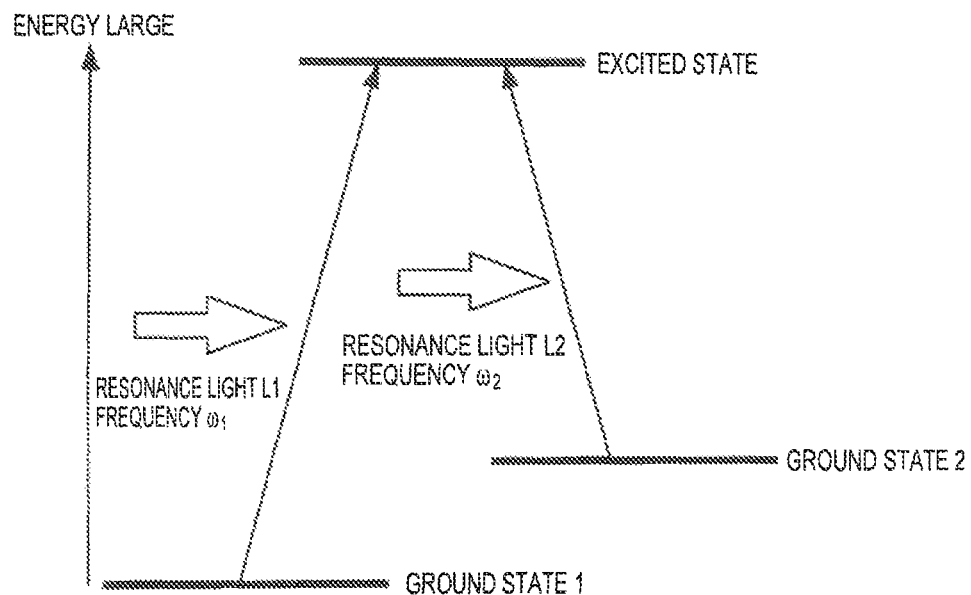
FIG. 16 is a view for illustrating the energy state of an alkali metal in the atomic cell of the atomic oscillator according to the third embodiment.
Figure 17:
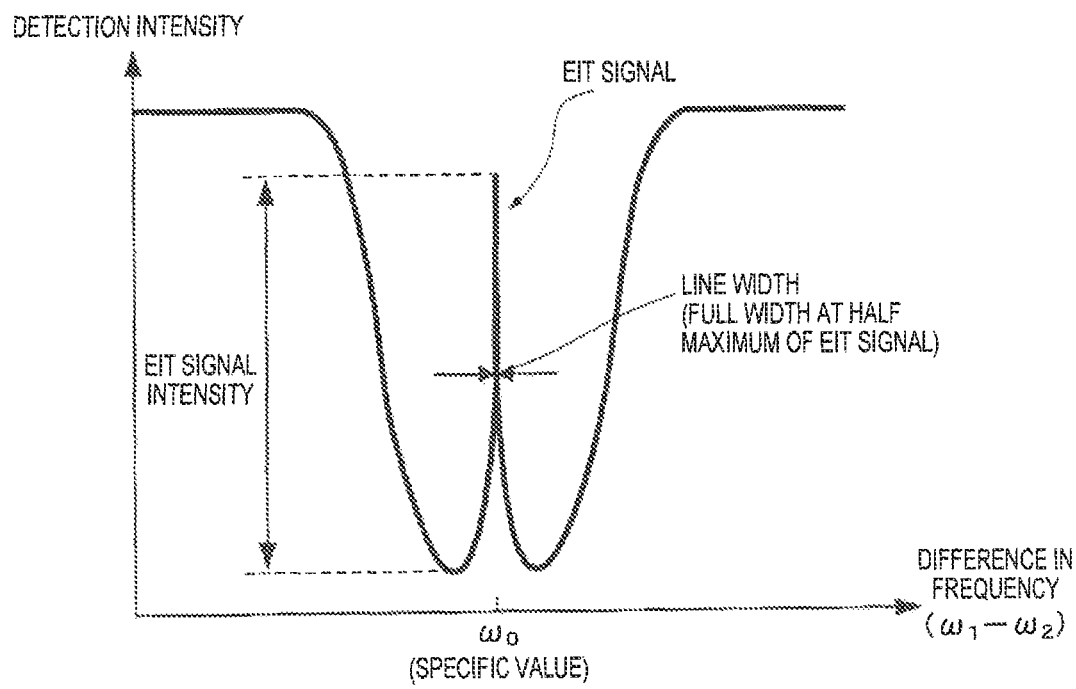
FIG. 17 is a graph showing a relationship between a difference in frequency between two lights emitted from a light emitter and a detection intensity detected by a light detector in the atomic oscillator according to the third embodiment.

FIG. 15 is a functional block diagram of an atomic oscillator 200 according to the third embodiment. FIG. 16 is a view for illustrating the energy state of an alkali metal in the atomic cell 100 of the atomic oscillator 200 according to the third embodiment. FIG. 17 is a graph showing a relationship between a difference in frequency between two lights emitted from a light emitter and a detection intensity detected by a light detector in the atomic oscillator 200 according to the third embodiment.

The atomic oscillator 200 is an atomic oscillator utilizing a quantum interference effect. The atomic oscillator 200 utilizing a quantum interference effect can be miniaturized as compared with an atomic oscillator utilizing a double resonance effect.

As shown in FIG. 15, the atomic oscillator 200 includes the atomic cell (gas cell) 100, a light emitter 210, optical components 220, 222, 224, and 226, a light detector 230, a heater 240, a temperature sensor 250, a magnetic field generator 260, and a controller 270.

First, the principle of the atomic oscillator 200 will be briefly described.

In the atomic oscillator 200, an alkali metal (metal atom) such as rubidium, cesium, or sodium in a gaseous state is enclosed in the atomic cell 100.

As shown in FIG. 16, the alkali metal has energy levels in a three-level system, and can be in the following three states: two ground states (ground states 1 and 2) having different energy levels and an excited state. Here, the ground state 1 is a lower energy state than the ground state 2.

When such an alkali metal in a gaseous state is irradiated with two resonance lights L1 and L2 having different frequencies, the light absorption rates (light transmittances) of the resonance lights L1 and L2 in the alkali metal change according to a difference ($\omega_1-\omega_2$) between the frequency $\omega_1$ of the resonance light L1 and the frequency $\omega_2$ of the resonance light L2. Also, when the difference ($\omega_1-\omega_2$) between the frequency $\omega_1$ of the resonance light L1 and the frequency $\omega_2$ of the resonance light L2 matches a frequency corresponding to the difference in energy between the ground state 1 and the ground state 2, excitation from the ground states 1 and 2 to the excited state stops, respectively. At this point, the resonance lights L1 and L2 are both transmitted through the alkali metal without being absorbed in the alkali metal. Such a phenomenon is called a CPT phenomenon or an electromagnetically induced transparency (EIT) phenomenon.

Here, for example, when the frequency $\omega_1$ of the resonance light L1 is fixed and the frequency $\omega_2$ of the resonance light L2 is changed, the detection intensity of the light detector 230 steeply increases at the time when the difference ($\omega_1-\omega_2$) between the frequency $\omega_1$ of the resonance light L1 and the frequency $\omega_2$ of the resonance light L2 matches a frequency $\omega_0$ corresponding to a difference in energy between the ground state 1 and the ground state 2 as shown in FIG. 17. Such a steep signal is referred to as an EIT signal. The EIT signal is an eigenvalue determined according to the type of alkali metal. Accordingly, an oscillator with high accuracy can be realized by using the EIT signal as a reference.

Hereinafter, the respective elements of the atomic oscillator 200 will be sequentially described in detail. The atomic cell 100 is as described in the above "1.1. Atomic Cell" and "1.2. Method for Producing Atomic Cell".

Light Emitter

The light emitter (light source) 210 emits the excitation light L which excites the alkali metal in the atomic cell 100. Specifically, the light emitter 210 emits two lights (the resonance light L1 and the resonance light L2) having different frequencies as described above as the excitation light L.

The resonance light L1 excites the alkali metal in the atomic cell 100 to change from the above-mentioned ground state 1 to the excited state. On the other hand, the resonance light L2 excites the alkali metal in the atomic cell 100 to change from the above-mentioned ground state 2 to the excited state.

The light emitter 210 is not particularly limited as long as it can emit an excitation light as described above. However, for example, a semiconductor laser such as a vertical cavity surface emitting laser (VCSEL) or the like is used.

The light emitter 210 is connected to an excitation light controller 272 of the controller 270 (described later) and is drive-controlled based on the detection result of the light detector 230. The temperature of the light emitter 210 is regulated at a predetermined temperature by a temperature regulating element (not shown) (such as a heating resistor or a Peltier element).

Optical Component

The optical components 220, 222, 224, and 226 are provided on the optical path of the excitation light L between the light emitter 210 and the atomic cell 100. In the example shown in FIG. 15, the first optical component 220, the second optical component 222, the third optical component 224, and the fourth optical component 226 are placed in this order from the light emitter 210 side to the atomic cell 100 side.

The first optical component 220 is a lens. The first optical component 220 can allow the excitation light L to be irradiated onto the atomic cell 100 without being wasted. The first optical component 220 has a function to make the excitation light L a parallel light. Therefore, the reflection of the excitation light L on the inner wall of the atomic cell 100 can be easily prevented. Due to this, the resonance of the excitation light in the atomic cell 100 is favorably caused, and as a result, the oscillation characteristics of the atomic oscillator 200 can be enhanced.

The second optical component 222 is a polarization plate. The second optical component 222 can adjust the polarization of the excitation light L from the light emitter 210 in a predetermined direction.

The third optical component 224 is a neutral-density filter (ND filter). The third optical component 224 can adjust (decrease) the intensity of the excitation light L incident on the atomic cell 100. Therefore, even if the output of the light emitter 210 is large, the intensity of the excitation light incident on the atomic cell 100 can be made a desired value.

The fourth optical component 226 is a $\lambda/4$ wave plate. The fourth optical component 226 can convert the excitation light L from the light emitter 210 from a linearly polarized light to a circularly polarized light (a right circularly polarized light or a left circularly polarized light).

Light Detector

The light detector 230 detects the intensity of the excitation light L (resonance lights L1 and L2) transmitted through the atomic cell 100. The light detector 230 is not particularly limited as long as it can detect the excitation light L, however, for example, a light detector (light receiving element) such as a solar cell or a photodiode is used. The light detector 230 is connected to the excitation light controller 272 of the controller 270 (described later).

Heater

The heater 240 heats the atomic cell 100 (specifically, the alkali metal in the atomic cell 100). According to this, the alkali metal in the atomic cell 100 can be maintained in a gaseous state at an appropriate concentration. The heater 240 generates heat by applying electricity (direct current) thereto, and is constituted by, for example, two heating resistors (not shown) provided on the outer surface of the atomic cell 100. The heater 240 is electrically connected to a temperature controller 274 of the controller 270 (described later), and the application of electricity thereto is controlled.

Here, one heating resistor is provided in the window 14 (incident side window) of the atomic cell 100, and the other heating resistor is provided in the window 16 (emission side window) of the atomic cell 100. By placing the heating resistor in each of the windows 14 and 16, the condensation of the alkali metal on the windows 14 and 16 can be prevented. As a result, the characteristics (oscillation characteristics) of the atomic oscillator 200 can be made excellent over a long period of time.

Such a heating resistor is constituted by a material having a property of transmitting the excitation light L, for example, a transparent electrode material such as an oxide such as indium tin oxide (ITO), indium zinc oxide (IZO), $In_3O_3$, $SnO_2$, Sb-containing $SnO_2$, or Al-containing ZnO.

The heating resistor can be formed by using, for example, a CVD method such as plasma CVD or thermal CVD, a dry plating method such as vacuum deposition, a sol-gel method, or the like.

The heater 240 is not limited to the above-mentioned configuration as long as it can heat the atomic cell 100, and any of various heaters can be used. Further, the heater 240 may be not in contact with the atomic cell 100. Further, the atomic cell 100 may be heated by using a Peltier element in place of the heater 240 or in combination with the heater 240.

Temperature Sensor

The temperature sensor 250 detects the temperature of the heater 240 or the atomic cell 100. Then, the calorific value of the heater 240 is controlled based on the detection result of the temperature sensor 250. According to this, the alkali metal in the atomic cell 100 can be maintained at a desired temperature. The placement position of the temperature sensor 250 is not particularly limited, and the temperature sensor 250 may be placed, for example, on the heater 240 or on the outer surface of the atomic cell 100.

The temperature sensor 250 is not particularly limited, and any of various known temperature sensors such as a thermistor and a thermocouple can be used. The temperature sensor 250 is electrically connected to the temperature controller 274 of the controller 270 (described later) through a wiring (not shown).

Magnetic Field Generator

The magnetic field generator 260 generates a magnetic field which causes a plurality of energy levels obtained by degenerating the alkali metal in the atomic cell 100 to be Zeeman split. The magnetic field generator 260 can improve the resolution by widening a gap between different energy levels obtained by degenerating the alkali metal by Zeeman splitting. As a result, the accuracy of the oscillation frequency of the atomic oscillator 200 can be enhanced.

The magnetic field generator 260 is constituted by, for example, Helmholtz coils placed so as to interpose the atomic cell 100 therebetween or solenoid coils placed so as to cover the atomic cell 100 therewith. According to this, uniform magnetic fields in one direction can be generated in the atomic cell 100. The magnetic field generated by the magnetic field generator 260 is a constant magnetic field (DC magnetic field), however, AC magnetic fields may be superimposed. The magnetic field generator 260 is electrically connected to a magnetic field controller 276 of the controller 270 (described later), and the application of electricity thereto is controlled.

Controller

The controller 270 controls the light emitter 210, the heater 240, and the magnetic field generator 260. The controller 270 includes the excitation light controller 272 which controls the frequencies of the resonance lights L1 and L2 of the light emitter 210, the temperature controller 274 which controls the temperature of the alkali metal in the atomic cell 100, and the magnetic field controller 276 which controls the magnetic field from the magnetic field generator 260.

The excitation light controller 272 controls the frequencies of the resonance lights L1 and L2 emitted from the light emitter 210 based on the detection result of the light detector 230. Specifically, the excitation light controller 272 controls the frequencies of the resonance lights L1 and L2 emitted from the light emitter 210 so that the difference in frequency $(\omega_1-\omega_2)$ detected by the light detector 230 becomes the above-mentioned frequency $\omega_0$ intrinsic to the alkali metal. Further, the excitation light controller 272 controls the center frequencies of the resonance lights L1 and L2 emitted from the light emitter 210. In addition, although not shown in the drawing, the excitation light controller 272 includes a voltage control type crystal oscillator (oscillation circuit), and outputs the oscillation frequency of the voltage control type crystal oscillator as the output signal of the atomic oscillator 200 while synchronizing and adjusting the oscillation frequency based on the detection result of the light detector 230.

The temperature controller 274 controls the application of electricity to the heater 240 based on the detection result of the temperature sensor 250. According to this, the atomic cell 100 can be maintained within a desired temperature range.

The magnetic field controller 276 controls the application of electricity to the magnetic field generator 260 so as to make the magnetic field generated from the magnetic field generator 260 constant.

Such a controller 270 is provided in, for example, an IC (Integrated Circuit) chip mounted on the substrate.

The atomic oscillator 200 includes the atomic cell 100 capable of reducing the relaxation of the electron spin state of the alkali metal by collision even under a higher temperature condition. Therefore, in the atomic oscillator 200, the intensity of the EIT signal can be increased, and also the line width of the EIT signal (the full width at half maximum of the EIT signal) can be decreased. Due to this, the atomic oscillator 200 can have excellent frequency stability.

4. Fourth Embodiment

Figure 18:
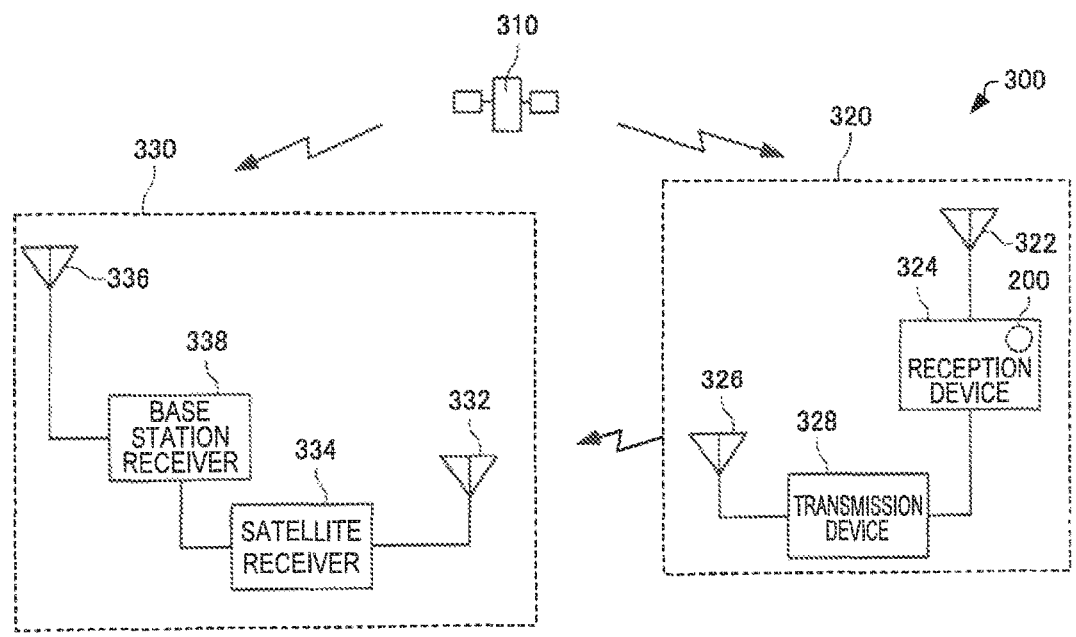
FIG. 18 is a view for illustrating an electronic apparatus according to fourth embodiment.

Next, an electronic apparatus according to a fourth embodiment will be described with reference to the drawing. The electronic apparatus according to the embodiment includes the atomic oscillator according to the embodiments. Hereinafter, a positioning system including the atomic oscillator 200 according to the embodiment will be described. FIG. 18 is a view for illustrating a positioning system 300 utilizing a GPS (Global Positioning System) satellite.

As shown in FIG. 18, the positioning system 300 includes a GPS satellite 310, a base station device 320, and a GPS receiving device 330.

The GPS satellite 310 transmits position information (GPS signal).

The base station device 320 includes, for example, a reception device 324 which highly accurately receives positioning information from the GPS satellite 310 through an antenna 322 placed at an electronic reference point (GPS continuous observation station) and a transmission device 328 which transmits the positioning information received by the reception device 324 through an antenna 326. The reception device 324 includes the atomic oscillator 200 as a reference frequency oscillation source. The positioning information received by the reception device 324 is transmitted by the transmission device 328 in real time.

The GPS receiving device 330 includes a satellite receiver 334 which receives positioning information from the GPS satellite 310 through an antenna 332 and a base station receiver 338 which receives positioning information from the base station device 320 through an antenna 336.

The positioning system 300 includes the atomic oscillator 200 which can have excellent frequency stability. Therefore, the positioning system 300 can have excellent reliability.

Incidentally, the electronic apparatus including the atomic oscillator according to the embodiment is not limited to the positioning system, and can also be applied to, for example, a mobile phone, a digital still camera, an inkjet type ejection device (for example, an inkjet printer), a personal computer (a mobile type personal computer and a laptop type personal computer), a television, a video camera, a video tape recorder, a car navigation device, a pager, an electronic organizer (including an electronic organizer with a communication function), an electronic dictionary, an electronic calculator, an electronic gaming machine, a word processor, a workstation, a videophone, a security television monitor, electronic binoculars, a POS terminal, a medical apparatus (for example, an electronic thermometer, a sphygmomanometer, a blood glucose meter, an electrocardiographic device, an ultrasonic diagnostic device, and an electronic endoscope), a fish finder, various types of measurement apparatuses, meters and gauges (for example, meters and gauges for automobiles, aircrafts, and ships), a flight simulator, terrestrial digital broadcasting, a mobile phone base station, and the like.

5. Fifth Embodiment

Figure 19:
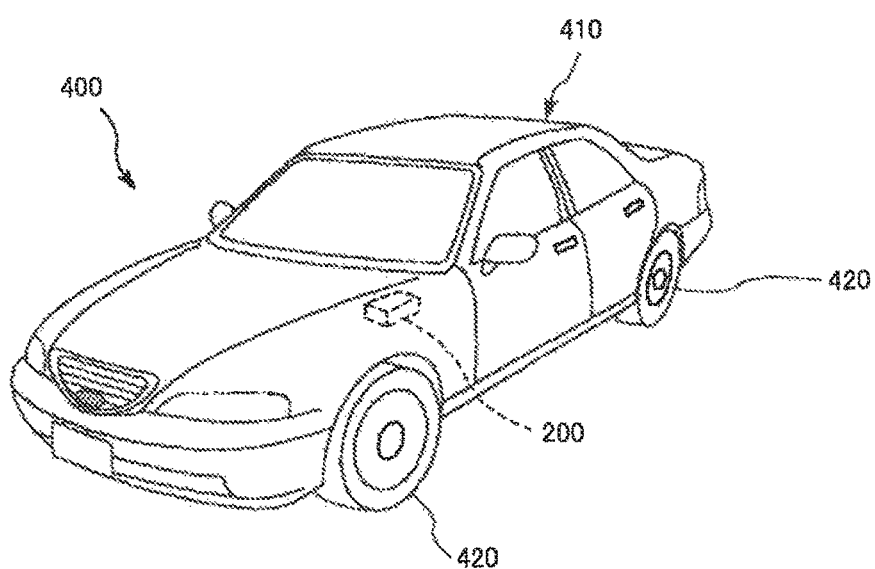
FIG. 19 is a view for illustrating a vehicle according to fifth embodiment.

Next, a vehicle according to a fifth embodiment will be described with reference to the drawing. The vehicle according to the embodiment includes the atomic oscillator according to the embodiments. Hereinafter, a car including the atomic oscillator 200 according to the embodiment will be described. FIG. 19 is a view for illustrating a car 400 according to the fifth embodiment.

As shown in FIG. 19, the car 400 includes a car body 410 and four wheels 420, and is configured to rotate the wheels 420 by a power source (engine) (not shown) provided in the car body 410. The car 400 includes the atomic oscillator 200.

The car 400 includes the atomic oscillator 200 which can have excellent frequency stability. Therefore, the car 400 can have excellent reliability.

The vehicle including the atomic oscillator according to the embodiment is not limited to the car, and can be applied to, for example, an aircraft such as a jet plane or a helicopter, a ship, a rocket, an artificial satellite, and the like.

The one or more embodiments of the invention may include substantially the same configurations (for example, configurations having the same functions, methods and results, or configurations having the same objects and effects) as the configurations described in the embodiments. Further, the one or more embodiments of the invention may include configurations in which a part that is not essential in the configurations described in the embodiments is substituted. Further, the one or more embodiments of the invention may include configurations having the same effects as in the configurations described in the embodiments, or configurations capable of achieving the same objects as in the configurations described in the embodiments. In addition, the one or more embodiments of the invention may include configurations in which known techniques are added to the configurations described in the embodiments.

What is claimed is:

1. An atomic cell, which is filled with an alkali metal therein comprising:
   a first coating layer that coats an inner wall and is formed from a first molecule;
   a second coating layer that coats the first coating layer and is formed from a second molecule having a nonpolar group and a functional group that undergoes an elimination reaction with the first molecule; and
   a third coating layer that coats the second coating layer and is formed from a nonpolar third molecule,
   wherein the first molecule is a metal oxide that does not undergo a substitution reaction with the alkali metal.

2. The atomic cell according to claim 1, wherein the first molecule is tantalum oxide, zirconium oxide, hafnium oxide, or titanium oxide.

3. The atomic cell according to claim 1, wherein the second molecule is an alkylsilane, an alcohol, or a polyimide.

4. The atomic cell according to claim 1, wherein the third molecule is polypropylene, polyethylene, or polymethylpentene.

5. The atomic cell according to claim 1, wherein the first molecule is tantalum oxide, the second molecule is octadecyltrimethoxysilane, and the third molecule is polypropylene.

6. An atomic cell manufacturing method comprising:
   forming a first coating layer by coating an inner wall of a substrate with a first molecule;
   forming a second coating layer by coating the first coating layer with a second molecule having a nonpolar group and a functional group that undergoes an elimination reaction with the first molecule;
   forming a third coating layer by coating the second coating layer with a nonpolar third molecule, wherein the first molecule is a metal oxide that does not undergo a substitution reaction with an alkali metal.

7. A quantum interference device comprising:
   the atomic cell according to claim 1;
   a light emitter that emits an excitation light that excites the alkali metal; and
   a light detector that detects the excitation light transmitted through the atomic cell.

8. An atomic oscillator comprising:
   the atomic cell according to claim 1;
   a light emitting section that emits an excitation light that excites the alkali metal; and
   a light detection section that detects the excitation light transmitted through the atomic cell.

9. An electronic apparatus comprising the atomic cell according to claim 1.

10. A vehicle comprising the atomic cell according to claim 1.

* * * * *